United States Patent
Avanzino

(10) Patent No.: US 7,307,321 B1
(45) Date of Patent: Dec. 11, 2007

(54) MEMORY DEVICE WITH IMPROVED DATA RETENTION

(75) Inventor: Steven Avanzino, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/089,707

(22) Filed: Mar. 25, 2005

(51) Int. Cl.
H01L 29/76 (2006.01)

(52) U.S. Cl. ...................... 257/379; 257/310

(58) Field of Classification Search ............... 438/693; 257/49, 306, 310, 379
See application file for complete search history.

(56) References Cited

U.S. PATENT DOCUMENTS

| | | | | |
|---|---|---|---|---|
| 5,041,369 | A | * | 8/1991 | Fukui et al. ............... 430/619 |
| 5,773,132 | A | * | 6/1998 | Blumberg et al. .......... 428/209 |
| 5,897,375 | A | * | 4/1999 | Watts et al. ............... 438/693 |
| 6,815,286 | B2 | * | 11/2004 | Krieger et al. ............. 438/238 |
| 2001/0019882 | A1 | * | 9/2001 | Jiang ....................... 438/584 |
| 2002/0055323 | A1 | * | 5/2002 | McClain et al. ............ 451/41 |
| 2003/0049560 | A1 | * | 3/2003 | Nirmal et al. ............. 430/200 |
| 2003/0053350 | A1 | * | 3/2003 | Krieger et al. ............ 365/200 |
| 2003/0155602 | A1 | * | 8/2003 | Krieger et al. ............ 257/306 |
| 2004/0237295 | A1 | * | 12/2004 | Wakizaka et al. .......... 029/830 |

OTHER PUBLICATIONS

"Theory of the copper vacancy in cuprous oxide", A.F. Wright and J. S. Nelson, Journal of Applied Physics, vol. 92, No. 10, Nov. 15, 2002, pp. 5849-5851.

"Copper Corrosion With and Without Inhibitors", V. Brusic, M. A. Frisch, B. N. Eldridge, F. P. Novak, F. B. Kaufman, B. M. Rush, G. S. Frankel, J. Electrochem.Soc., vol. 138, No. 8, Aug. 1991, pp. 2253-2259.

* cited by examiner

Primary Examiner—Mary Wilczewski
Assistant Examiner—Tsz Chiu

(57) ABSTRACT

The present memory device includes a first electrode, a passive layer, for example $Cu_2S$, on the first electrode, an active layer on the passive layer and including an azole compound, and a second electrode on the active layer. The azoles compound may be for example benzotriazole or 1,2,4-triazole. The active layer may also include $Cu_2O$.

10 Claims, 4 Drawing Sheets

MEMORY DEVICE WITH IMPROVED DATA RETENTION

BACKGROUND OF THE INVENTION

1. Technical Field

This invention relates generally to memory devices, and more particularly, to a memory device with improved data retention.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state, also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid state devices are generally encumbered with a complex architecture which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

FIG. 1 illustrates a type of memory device 30 which includes advantageous characteristics for meeting these needs. The memory device 30 includes a Cu electrode 32, a $Cu_2S$ passive layer 34 on the electrode 32, a $Cu_2O$ active layer 36 on the layer 34, and a Ti electrode 38 on the active layer 36. Initially, assuming that the memory device 30 is unprogrammed, in order to program the memory device 30, an increasingly negative voltage is applied to the electrode 38, while the electrode 32 is held at ground, so that an increasing electrical potential is applied across the memory device 30 from a higher to a lower potential in the direction from electrode 32 to electrode 38, until electrical potential $V_{pg}$ (the "programming" electrical potential) is reached (see FIG. 2, a plot of memory device current vs. electrical potential applied across the memory device 30). This potential $V_{pg}$ is sufficient to cause copper ions to be attracted from the superionic layer 34 toward the electrode 38 and into the active layer 36, causing the active layer 36 (and the overall memory device 30) to switch to a low-resistance or conductive state (A). Upon removal of such potential (B), the copper ions drawn into the active layer 36 during the programming step remain therein, so that the active layer 36 (and memory device 30) remain in a conductive or low-resistance state, as indicated by the resistance characteristic (B).

In order to erase the memory device (FIG. 2), an increasingly positive voltage is applied to the electrode 38, while the electrode 32 is held at ground, so that an increasing electrical potential is applied until electrical potential $V_{er}$ (the "erase" electrical potential) is applied across the memory device 30 from a higher to a lower electrical potential in the reverse direction. This potential $V_{er}$ is sufficient to cause copper ions to be repelled from the active layer 36 toward the electrode 32 and into the superionic layer 34 (C), in turn causing the active layer 36 (and the overall memory device 30) to be in a high-resistance or substantially non-conductive state. This state remains upon removal of such potential from the memory device 30.

FIG. 2 also illustrates the read step of the memory device 30 in its programmed (conductive) state and in its erased (nonconductive) state. An electrical potential $V_r$ (the "read" electrical potential) is applied across the memory device 30 from a higher to a lower electrical potential in the same direction as the electrical potential $V_{pg}$. This electrical potential is less than the electrical potential $V_{pg}$ applied across the memory device 30 for programming (see above). In this situation, if the memory device 30 is programmed, the memory device 30 will readily conduct current (level L1), indicating that the memory device 30 is in its programmed state. If the memory device 30 is erased, the memory device 30 will not conduct current (level L2), indicating that the memory device 30 is in its erased state.

Reference is made to the paper THEORY OF COPPER VACANCY IN CUPROUS OXIDE by A. F. Wright and J. S. Nelson, Journal of Applied Physics, Volume 92, Number 10, pages 5849-5851, Nov. 15, 2002, which is hereby incorporated by reference. That paper describes the process of diffusion of copper ions through $Cu_2O$. In the diffusion process, typically involving a vacancy mechanism wherein atoms jump from a first (atom) state to a second (vacancy) state, atoms need energy to break bonds with neighbors and to provide necessary distortion of the material between the states. The above-cited paper indicates that the activation energy $E_a$ for moving a copper ion from one state to the next in the $Cu_2O$ is approximately 0.3 eV. FIG. 3 illustrates movement (arrow F) from state 1 (unprogrammed) to state 2 (programmed). In such process, the activation energy is indicated by the arrow $E_{a1}$. FIG. 4 illustrates movement (arrow G) from state 2 (programmed) to state 1 (unprogrammed). In such process, the activation energy is indicated by the arrow $E_{a2}$.

It has been found that with this relatively low barrier energy $E_{a2}$ to movement of copper ions through the $Cu_2O$, over a period of time, copper ions in the active layer of a programmed memory device can readily diffuse through and drift from the active layer 36 into the passive layer 34, undesirably reducing the conductivity of the programmed memory device 30, i.e., causing the memory device 30 to undesirably lose its programmed state. It will readily be seen that loss of programmed state results in data loss. Therefore, what is needed a memory device which stably retains its conductive, low resistance state to ensure proper data retention

DISCLOSURE OF THE INVENTION

Broadly stated, the present memory device comprises a first electrode, a passive layer on the first electrode, an active layer on the passive layer and comprising an azole compound, and a second electrode on the active layer.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiment when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventor for practicing the invention.

Initially, reference is made to the paper COPPER CORROSION WITH AND WITHOUT INHIBITORS, by V. Brusic, M. A. Frisch, B. N. Eldridge, F. P. Novak, F. B. Kaufman, B. M. Rush, and G. S. Frankel, J. Electrochem. Soc., Vol. 136, No. 8, August 1991, incorporated by reference herein. That paper describes the use of organic azoles for inhibiting corrosion of copper through the formation of a copper-azole protective layer.

Figure 5:
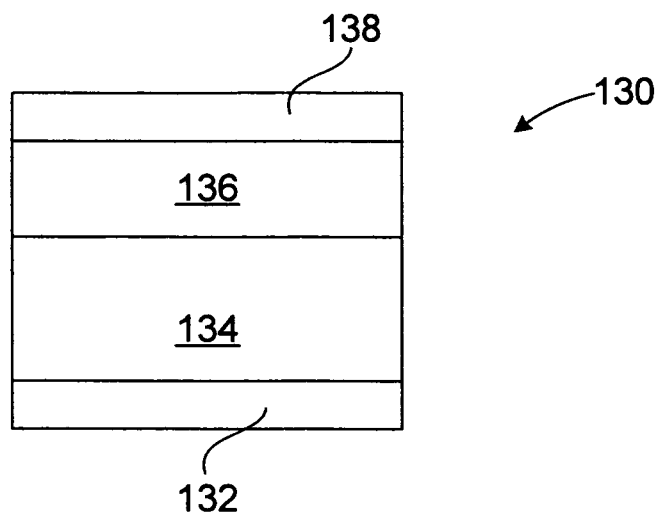
FIG. 5 is a cross-sectional view of a first embodiment of the present memory device.

FIG. 5 illustrates a first embodiment of memory device 130 in accordance with the present invention. The memory device 130 includes a Cu electrode 132, a $Cu_2S$ passive layer 134 on the electrode 132, an active layer 136 on the layer 134, and a Ti electrode 138 on the active layer 36. In this first embodiment, the active layer 136 is made up of an azole compound, in particular, benzotriazole. The chemical structure of benzotriazole is:

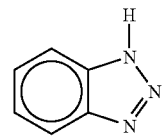

Figure 1:
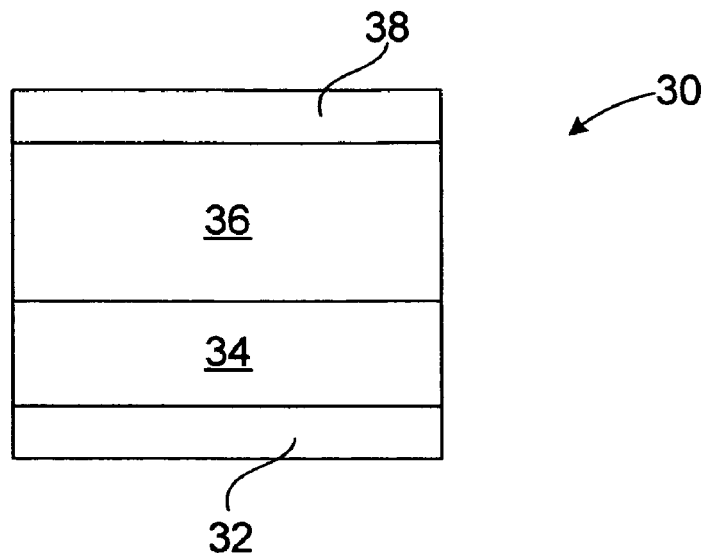
FIG. 1 is a cross-sectional view of a typical memory device.
Figure 2:
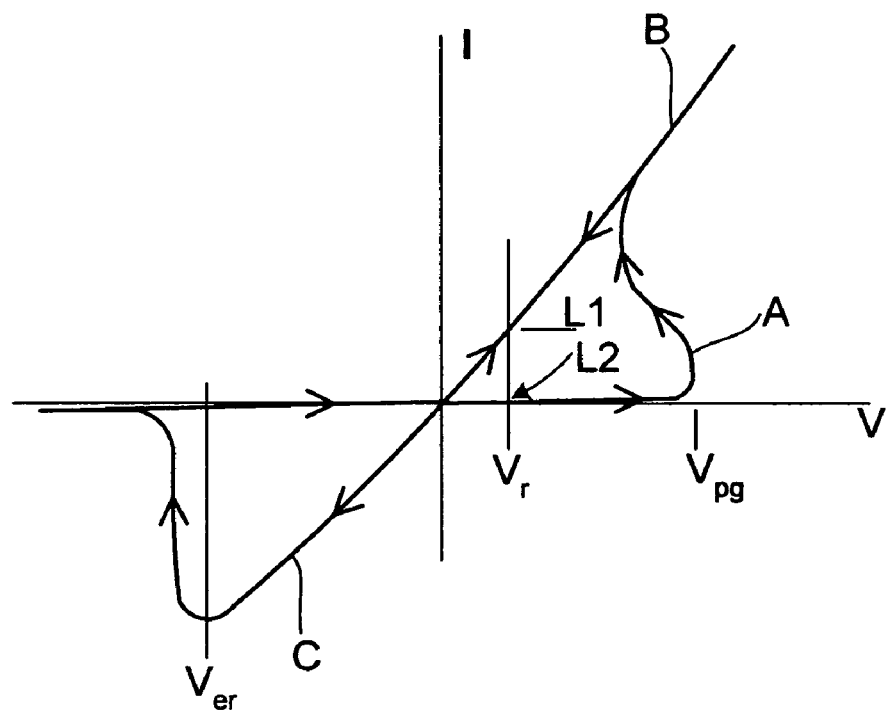
FIG. 2 is a plot of current vs. voltage in the programming, erasing, and reading of the memory device of FIG. 1.
Figure 3:
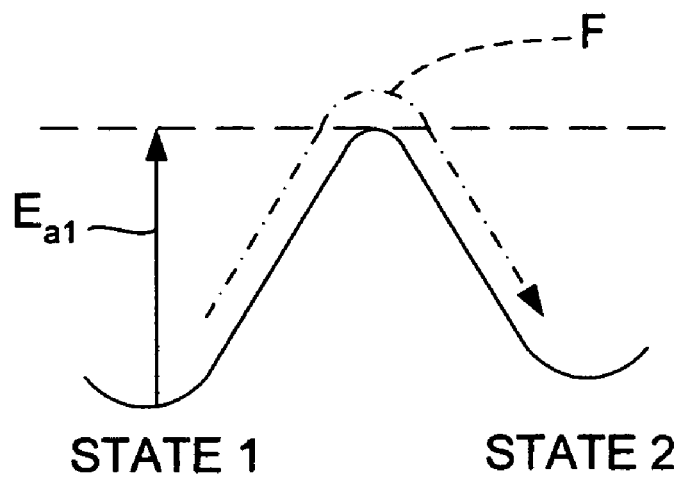
FIGS. 3 and 4 are graphs illustrating activation energy of the device of FIG. 1.
Figure 4:
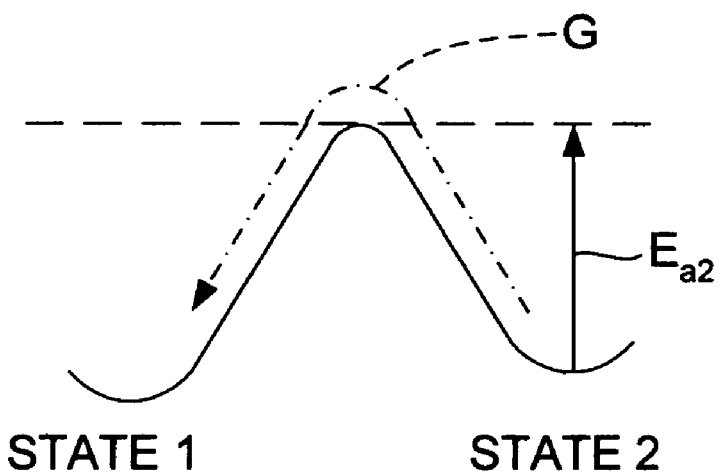
Figure 6:
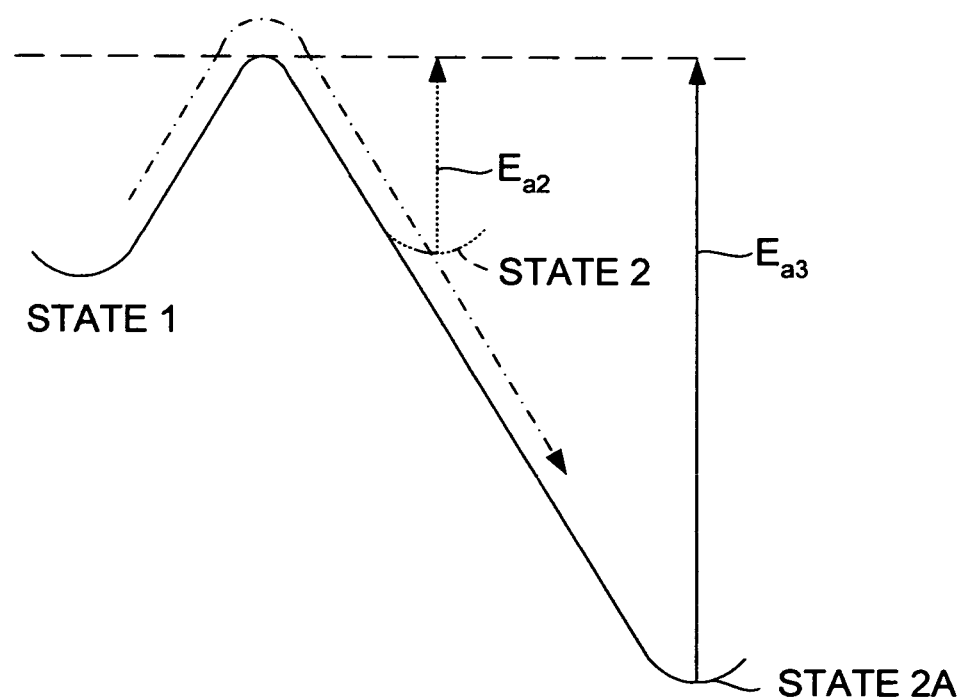
FIG. 6 is a graph illustrating characteristics of the device of FIG. 5.

During programming of the memory device 130 (by applying an increasingly negative voltage to the electrode 138 while holding the electrode 132 at ground), copper ions introduced into the active layer 136 from the passive layer 134 bind to the nitrogen in the active layer 136, enhancing retention of the ions in the active layer for improved, stable data retention. As previously described with regard to FIG. 4, and repeated in FIG. 6, the activation energy from the (prior art) state 2 energy level is indicated by the arrow $E_{a2}$. However, in the present approach, with the strong bonding between the copper ions and the benzotriazole making up the active layer 136, the activation energy from the state 2A energy level is greatly increased over the activation energy $E_{a2}$, as indicated by the arrow $E_{a3}$. This substantially increased activation energy in the erase direction greatly inhibits movement of copper ions within and through the active layer 136 from state 2A (programmed state) to state 1 (unprogrammed state) into the passive layer 134. Because of this greatly increased erase energy requirement, when the memory device 130 is programmed, the memory device 130 retains its programmed, conductive, low resistance state in a stable manner and without undesirable loss of data.

The operating characteristics of the memory device 130 may be altered by providing the active layer 136 as a mixture of $Cu_2O$ and benzotriazole. In such case, the degree of polymerization of the active layer 136 is substantially increased. High thermal stability (350° C.) is achieved with such polymerization.

Figure 7:
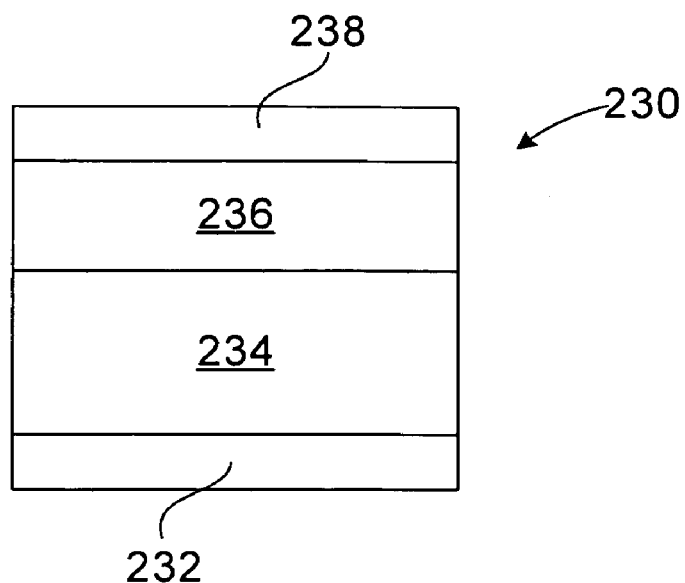
FIG. 7 is a cross-sectional view of a second embodiment of the present memory device.

In a second embodiment of the invention (FIG. 7), the memory device 230 includes a Cu electrode 232, a $Cu_2S$ passive layer 234 on the electrode 232, an active layer 236 on the layer 234, and a Ti electrode 238 on the active layer 236. In this second embodiment, the active layer 236 is also made up of an azole compound, in particular, 1,2,4-triazole. The chemical structure of 1,2,4-triazole is:

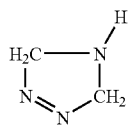

Figure 8:
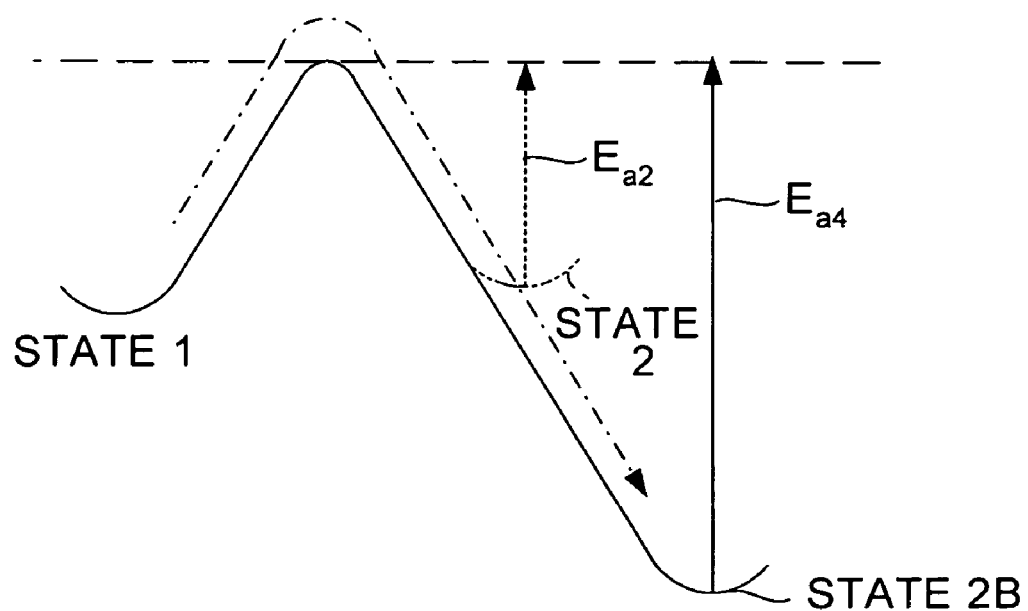
FIG. 8 is a graph illustrating characteristics of the device of FIG. 7.

During programming of the memory device 230 (by applying an increasingly negative voltage to the electrode 238 and holding the electrode 232 at ground), copper ions introduced into the active layer 236 from the passive layer 234 bind to the nitrogen in the active layer 236, enhancing retention of the ions in the active layer 236 or improved, stable data retention. The activation energy from the (prior art) state 2 energy level is indicated by the arrow $E_{a2}$ (FIG. 8). In the present approach, with the bonding between the copper ions and the 1,2,4-triazole making up the active layer 136, the activation energy from the state 2B energy level is increased over the activation energy $E_{a2}$, as indicated by the arrow $E_{a4}$. However, the bond between copper ions and 1,2,4-triazole is not as strong as the bond between copper ions and benzotriazole (previous embodiment). Thus, the energy required to erase the memory device 230 of the present embodiment is not as great as that required to erase the memory device 130 of the previous embodiment (compare FIGS. 6 and 8). However, the increased activation energy in the erase direction is of a sufficient level to inhibit movement of copper ions within and through the active layer 236 from state 2B (programmed state) to state 1 (unprogrammed state) into the passive layer 234, so that the memory device 130 retains its programmed, conductive, low resistance state in a stable manner and without undesirable loss of data.

The operating characteristics of the memory device may be altered by providing the active layer as a mixture of $Cu_2O$ and 1,2,4-triazole. Again, in such case, the degree of polymerization of the active layer is substantially increased. Similar to the above, high thermal stability (350° C.) is achieved with such polymerization It will be seen that herein is provided an approach wherein it is insured that the programmed state of the memory device is retained in a highly stable manner, i.e., with minimal degradation, increasing the operational efficiency of the memory structure made up of such memory devices.

The foregoing description of the embodiment of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory device comprising:
   first and second electrodes;
   a passive layer; and
   an active layer comprising an azole compound;
   the passive and active layers being between the first and second electrodes;
   wherein the azole compound comprises benzotriazole.

2. The memory device of claim 1 wherein the active layer further comprises copper.

3. The memory device of claim 1 wherein the active layer further comprises $Cu_2O$.

4. A memory device comprising:
   first and second electrodes;
   a passive layer; and
   an active layer comprising an azole compound;
   the passive and active layers being between the first and second electrodes, wherein the azole compound comprises 1,2,4-triazole.

5. The memory device of claim 1 wherein the passive layer comprises $Cu_2S$.

6. The memory device of claim 4 wherein the active layer further comprises $Cu_2O$.

7. The memory device of claim 4 wherein the passive layer comprises $Cu_2S$.

8. The memory device of claim 4 wherein the active layer further comprises copper.

9. The memory device of claim 1 wherein the passive layer is on the first electrode, the active layer is on the passive layer, and the second electrode is on the active layer.

10. The memory device of claim 4 wherein the passive layer is on the first electrode, the active layer is on the passive layer, and the second electrode is on the active layer.

* * * * *